(12) United States Patent
Aisenbrey

(10) Patent No.: US 7,244,890 B2
(45) Date of Patent: Jul. 17, 2007

(54) LOW COST SHIELDED CABLE MANUFACTURED FROM CONDUCTIVE LOADED RESIN-BASED MATERIALS

(76) Inventor: Thomas Aisenbrey, 5820 Wood Sorrel Dr., Littleton, CO (US) 80123

( * ) Notice: Subject to any disclaimer, the term of this patent is extended or adjusted under 35 U.S.C. 154(b) by 368 days.

(21) Appl. No.: 10/811,371

(22) Filed: Mar. 26, 2004

(65) Prior Publication Data
US 2005/0006126 A1 Jan. 13, 2005

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/484,399, filed on Jul. 2, 2003, provisional application No. 60/463,068, filed on Apr. 15, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01B 7/34* (2006.01)
(52) U.S. Cl. ...................................... 174/36
(58) Field of Classification Search ................ 174/36, 174/110 R, 120 C, 120 SC, DIG. 8; 428/34.9, 428/35.1–35.3, 36.4, 58, 192, 200, 347, 349; 138/150, 170, 128, 174
See application file for complete search history.

(56) References Cited

U.S. PATENT DOCUMENTS 3,576,387 A * 4/1971 Derby ......................... 174/36
4,207,364 A * 6/1980 Nyberg ....................... 138/141
4,559,973 A * 12/1985 Hane et al. .................. 138/138
4,576,993 A * 3/1986 Tamplin et al. ............. 525/240

(Continued)

FOREIGN PATENT DOCUMENTS

GB 2377449 A 1/2003

OTHER PUBLICATIONS

U.S. Appl. No. 10/309,429, filed Dec. 4, 2002, assigned to the same assignee, "Low Cost Antennas Using Conductive Plastics or Conductive Composites".
U.S. Appl. No. 10/075,778, filed Feb. 14, 2002, assigned to the same assignee, "Low Cost Antennas Using Conductive Plastics or Conductive Composites".

*Primary Examiner*—William H. Mayo, III
(74) *Attorney, Agent, or Firm*—Douglass Schnabel

(57) ABSTRACT

Shielded cable devices are formed of a conductive loaded resin-based material. Non-insulated conductors with shields, coaxial shielded cables, twisted pair shielded cables, and multi-wire shielded cables are described. The conductive loaded resin-based material includes micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or from metals such as stainless steel, nickel, copper, silver, that may also be metallic plated, or from a combination of non-metal, plated, or in combination with, metal powders.

32 Claims, 10 Drawing Sheets

U.S. PATENT DOCUMENTS

| | | | |
|---|---|---|---|
| 4,598,165 A * | 7/1986 | Tsai | 174/36 |
| 4,678,699 A * | 7/1987 | Kritchevsky et al. | 428/175 |
| 4,680,093 A * | 7/1987 | Morin | 428/626 |
| 4,735,833 A * | 4/1988 | Chiotis et al. | 428/34.5 |
| 4,803,103 A * | 2/1989 | Pithouse et al. | 428/34.5 |
| 4,816,184 A * | 3/1989 | Fukuda et al. | 252/511 |
| 5,098,753 A * | 3/1992 | Gregory et al. | 428/34.9 |
| 5,110,638 A * | 5/1992 | Vogdes et al. | 428/35.1 |
| 5,302,428 A * | 4/1994 | Steele et al. | 428/34.9 |
| 5,470,622 A * | 11/1995 | Rinde et al. | 428/34.9 |
| 5,926,949 A | 7/1999 | Moe et al. | 29/828 |
| 5,946,798 A | 9/1999 | Buluschek | 29/828 |
| 6,084,295 A | 7/2000 | Horiuchi et al. | 257/690 |
| 6,137,058 A | 10/2000 | Moe et al. | 174/102 R |
| 6,225,565 B1 * | 5/2001 | Prysner | 174/120 SC |
| 6,265,667 B1 | 7/2001 | Stipes et al. | 174/102 R |
| 2002/0037376 A1 * | 3/2002 | Fenton | 428/34.9 |
| 2002/0142653 A1 | 10/2002 | Hosaka et al. | 439/578 |
| 2003/0090345 A1 | 5/2003 | Cooray et al. | 333/239 |

* cited by examiner

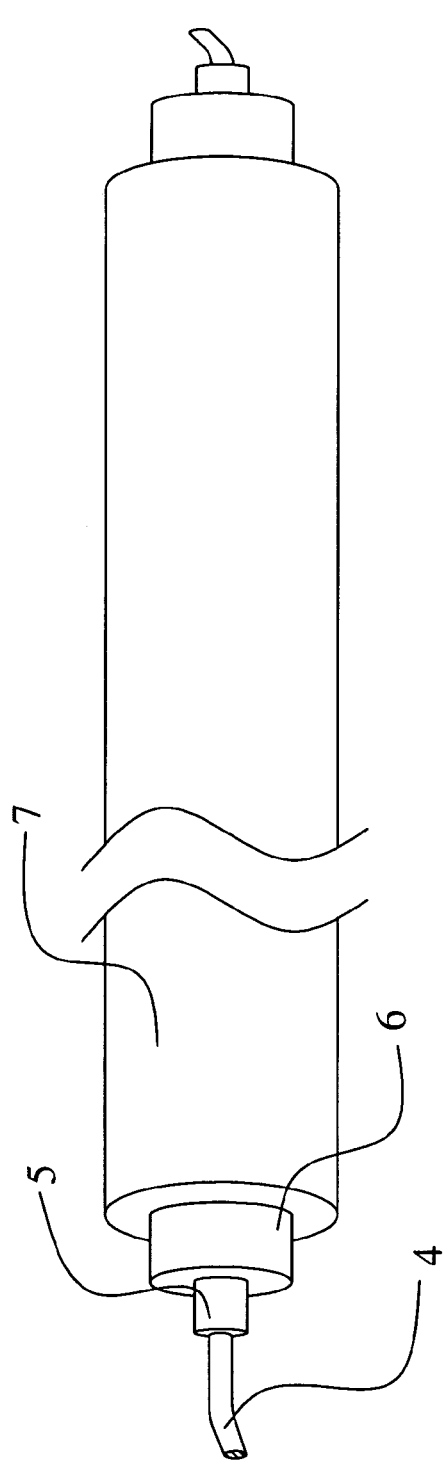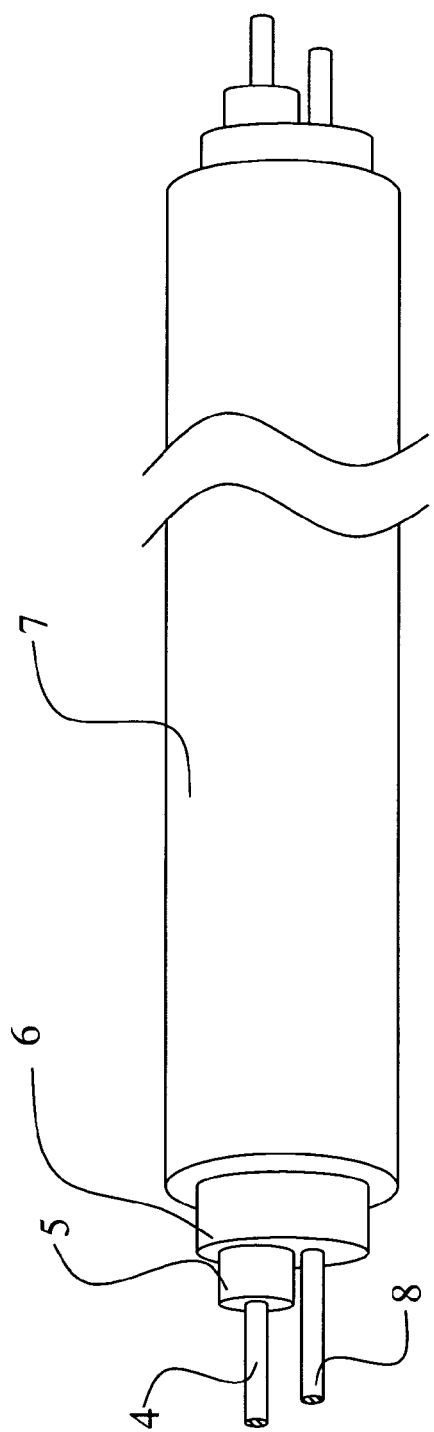
FIG. 1c
FIG. 1d

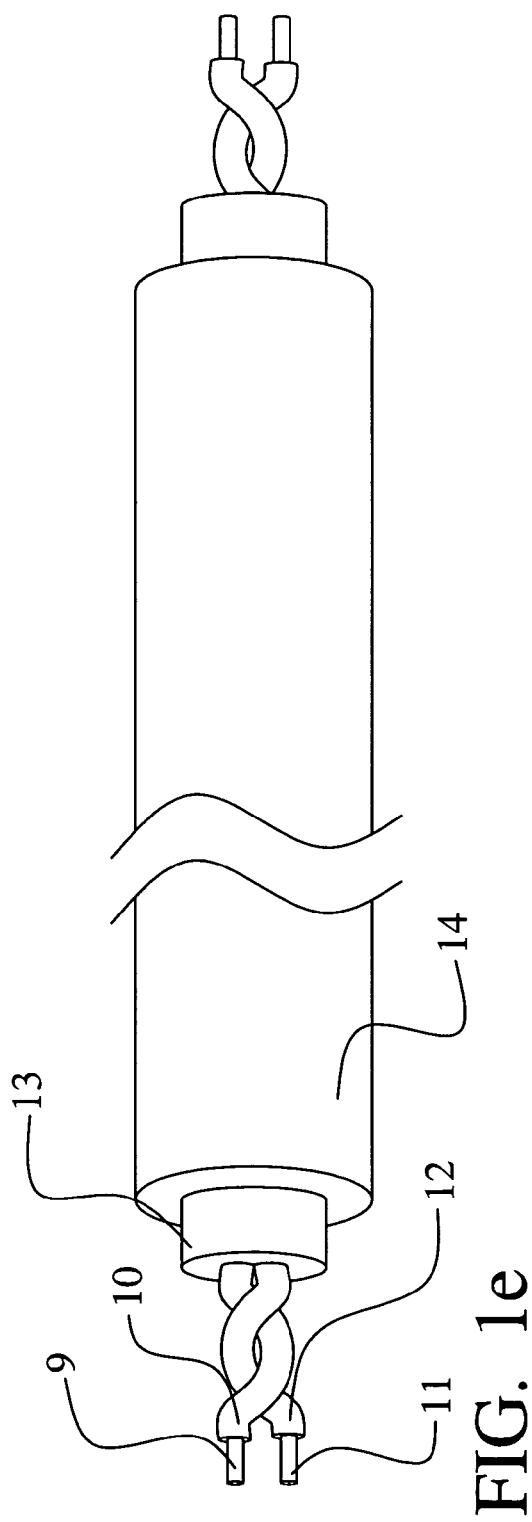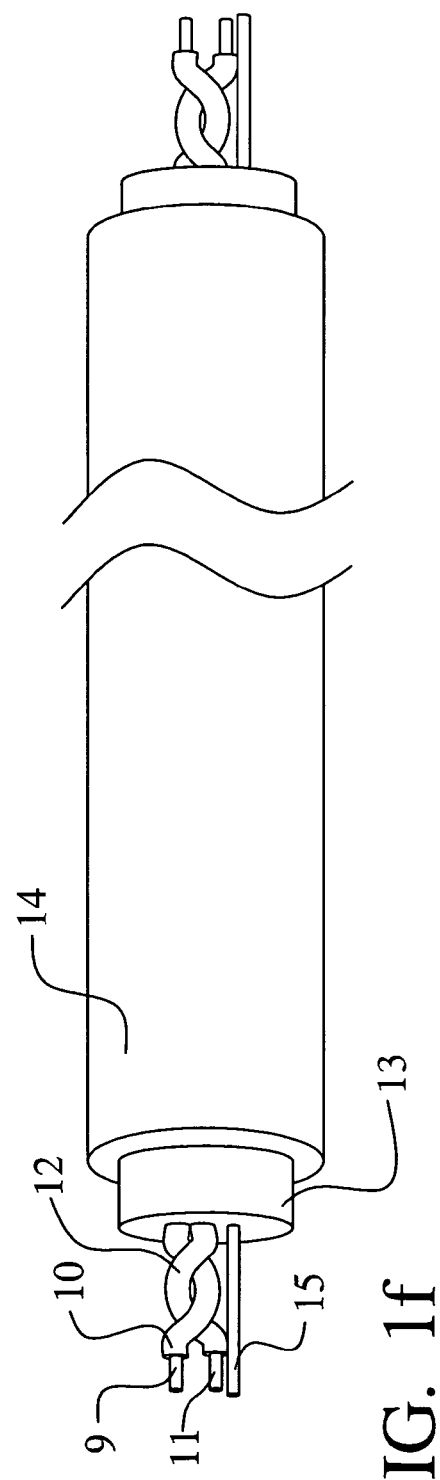

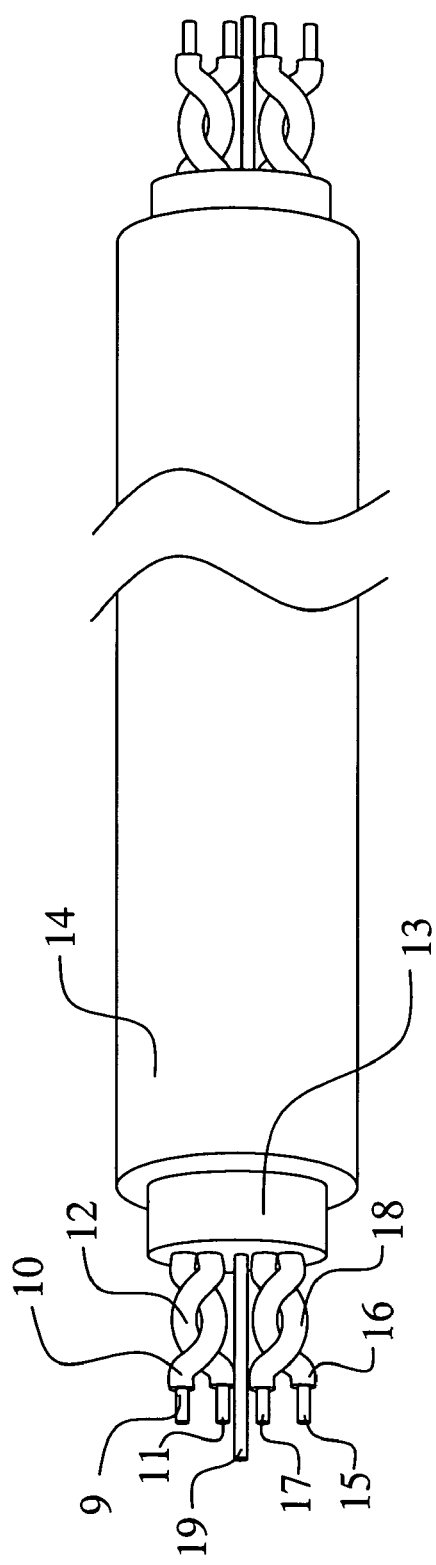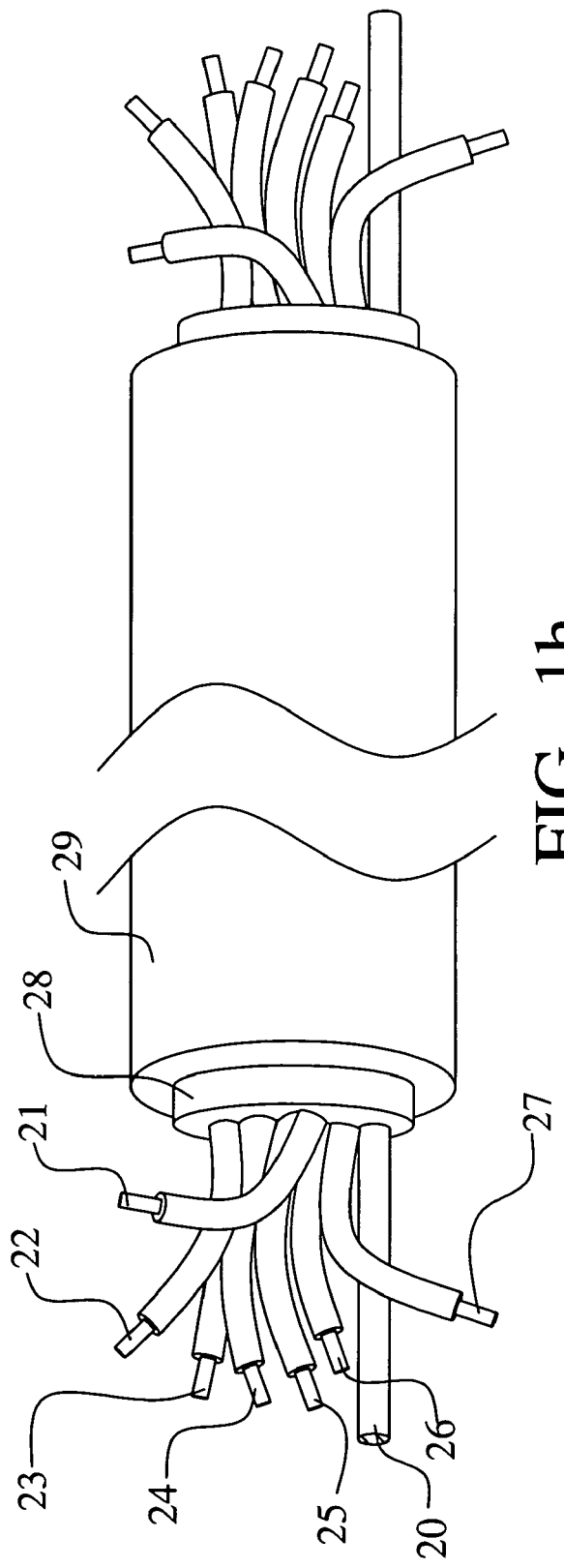

ately as U.S. Pat. No. 6,870,516, also incorporated by reference in its entirety,

LOW COST SHIELDED CABLE MANUFACTURED FROM CONDUCTIVE LOADED RESIN-BASED MATERIALS

This Patent Application claims priority to the U.S. Provisional Patent Application 60/463,068, filed on Apr. 15, 2003 and to the U.S. Provisional Patent Application 60/484, 399, filed on Jul. 2, 2003 which are herein incorporated by reference in their entirety.

This Patent Application is a Continuation-in-Part of INT01-002CIP, filed as U.S. patent application Ser. No. 10/309,429, filed on Dec. 4, 2002, now issued as U.S. Pat. No. 6,870,516, also incorporated by reference in its entirety, which is a Continuation-in-Part application filed as U.S. patent application Ser. No. 10/075,778, filed on Feb. 14, 2002, now issued as U.S. Pat. No. 6,741,221, which claimed priority to U.S. Provisional Patent Applications Ser. No. 60/317,803, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to shielded cable and, more particularly, to shielded cables molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Shielded cables are used in many applications where electromagnetic interference (EMI) or radio frequency interference (RFI) are concerns. By routing an electric signal in a shielded cable, the electric signal is protected from environmental sources of EMI/RFI that could be coupled onto the signal. Conversely, a shielded signal generates less radiated EMI/RMI emissions. Shielding of signals is frequently necessary in computers, audio electronics, avionics, and automotive electronics.

A shielded cable comprises three main components: signal wiring, shielding, and outer insulation. The signal wiring may comprise a single wire or multiple wires. For example, a coaxial shielded cable comprises a single signal wire. This wire comprises a conductor, typically a stranded or braided metal, that is surrounded by an insulating material. As another example, a twisted pair of wires, each comprising an insulated conductor, may be routed in the cable. Further, a large number of wires, each comprising an insulated conductor, may be routed in parallel through the cable. The shielding layer surrounds the signal wiring. In a typical application, this shielding layer is connected to a dc reference and, more typically, to ground. This shielding layer forms a Faraday cage that prevents EMI/RFI coupling between the shielded signal wiring and an external source and/or receiver. Finally, an outer jacket of insulating material surrounds the shielding layer. This outer jacket prevents shorting of the shielding layer and serves as an environmental barrier to protect the shielded cable from moisture and mechanical damage.

Several prior art inventions relate to shielded cable devices and methods of manufacture. U.S. Pat. No. 6,084, 295 to Horiuchi et al describes a semiconductor device mounted on a circuit board. Wires are bonded between the semiconductor device and the circuit board. The wires comprise a gold wire surrounded by a resinous film insulator. After bonding, an electro-conductive resin film is formed over the wires and the semiconductor device. If the conductive resin film is set to a ground potential, then the bonded wires constitute a coaxial cable line. The conductive resin may contain silver filler. U.S. Patent Application Ser. No. 2002/0142653 to Hosaka et al shows a binding member, or connector, to connect a coaxial cable to an electrical signal. The binding member is constructed from a conductive resin material. The conductive resin material comprises a mixture of thermoplastic resin, lead-free solder, and powdered metal. U.S. Patent Application Ser. No. 2003/0090345 to Cooray et al describes a method to form a coaxial cable. A polymer/resin is first formed around a conductor. Then, a conductive layer is formed on the surface of the polymer/resin by a chemical reaction. The conductive layer forms the conductive shield for the cable. U.S. Pat. No. 6,265,667 to Stipes et al describes a method to manufacture a coaxial cable. An insulating layer is formed surrounding a central conductor by extrusion. A shielding layer is formed by wrapping metal foil and polyester tape and metal braid around the insulating layer. U.S. Pat. No. 5,946,798 to Buluschek discloses a method to manufacture a coaxial cable. The steps used in formation of the center conductor and the insulating layer are described. The insulating layer is formed by extrusion. U.S. Pat. No. 6,137,058 and U.S. Pat. No. 5,926,949 to Moe et al each describe a method to form a coaxial cable. A polyethylene foam is formed surrounding the center conductor by extrusion. A conductive shield is formed around the insulator by first forming a cylindrical shape around the insulator and then welding the seam. An outer jacket of polymer is then formed around the shield.

SUMMARY OF THE INVENTION

A principal object of the present invention is to provide an effective shielded cable device.

A further object of the present invention is to provide a method to form a shielded cable device.

A further object of the present invention is to provide a shielded cable device having a shield molded of conductive loaded resin-based materials.

A yet further object of the present invention is to provide a cable shield molded of conductive loaded resin-based materials where the cable shield is formed by extrusion.

A yet further object of the present invention is to provide a cable shield molded of conductive loaded resin-based materials where the cable shield is formed by wrapping a fabric-like conductive loaded resin-based material.

A yet further object of the present invention is to provide a shielded cable where the cable shield and the outer jacket are co-extruded.

In accordance with the objects of this invention, a shielded cable device is achieved. The device comprises a conductor and a conductive shield surrounding the conductor. The conductive shield comprises a conductive loaded, resin-based material comprising conductive materials in a base resin host.

Also in accordance with the objects of this invention, a method to form a shielded cable device is achieved. The method comprises providing a conductor and forming a conductive shield surrounding the conductor. The conductive shield comprises a conductive loaded, resin-based material further comprising conductive materials in a resin host.

BRIEF DESCRIPTION OF THE DRAWINGS

In the accompanying drawings forming a material part of this description, there is shown:

FIGS. 1a through 1h illustrate preferred embodiments of the present invention showing a various shielded cable devices molded of conductive resin-based material.

DESCRIPTION OF THE PREFERRED EMBODIMENTS

Figure 1A:
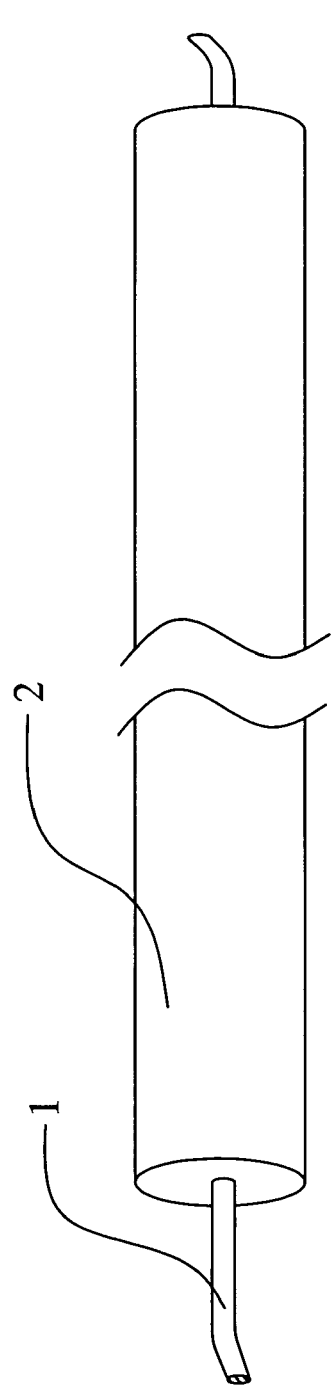

This invention relates to shielded cable molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of shielded cable fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the shielded cable devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of shielded cable significantly lowers the cost of materials and the design and manufacturing processes used to hold ease of close tolerances, by forming these materials into desired shapes and sizes. The shielded cable can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the shielded cable and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming shielded cable that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a to corrosion and/or metal electrolysis resistant conductive loaded resin-based material is achieved.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

Referring now to FIGS. 1a through 1h, several preferred embodiments of shielded cables of the present invention are illustrated. The embodiments show various shielded cable devices molded of conductive resin-based material. Several important features of the present invention are shown and discussed below.

Referring now to particularly to FIG. 1a, a first preferred embodiment shielded cable of the present invention is illustrated. In this embodiment, a conductive loaded resin-based material 2 according to the present invention is formed over a non-insulated wire 1. More preferably, the conductive loaded resin-based material 2 is extrusion molded over the bare wire 1. In this configuration, the conductor 1 is electrically shorted to the conductive loaded resin-based shield 2. That is, the network of micron conductive fiber and/or micron conductive powder of the conductive loaded resin-based material 2 contacts the wire 1 such that there is an electrical short between the wire 1 and the conductive loaded resin-based material 2. In this embodiment, the shielding layer 2 is therefore shorted to the conductor 1. The conductor 1 may comprise any conductive material and, more preferably, comprises a metal such as copper or aluminum as is well known in the art. The conductor 1 may comprise a solid piece of metal or a stranded cable comprising many strands of metal wound together as is well known in the art.

This embodiment is useful for creating devices such as antennas or heaters or combinations of antennas and heat sinks. For example, the combination of the wire 1 and the conductive loaded resin-based material 2 can form a useful antenna or antenna loop. Alternatively, the combination of the wire 1 and conductive loaded resin-based material 2 may be used to form a heating device. An applied forward voltage on the conductive loaded resin-based material 2 creates electron collision and results in an excellent radiant heating device. Finally, the conductive loaded resin-based material 2 can act as a heat sink device for the wire 1. This is a useful combination where the wire 1 is used as an antenna.

Figure 1B:
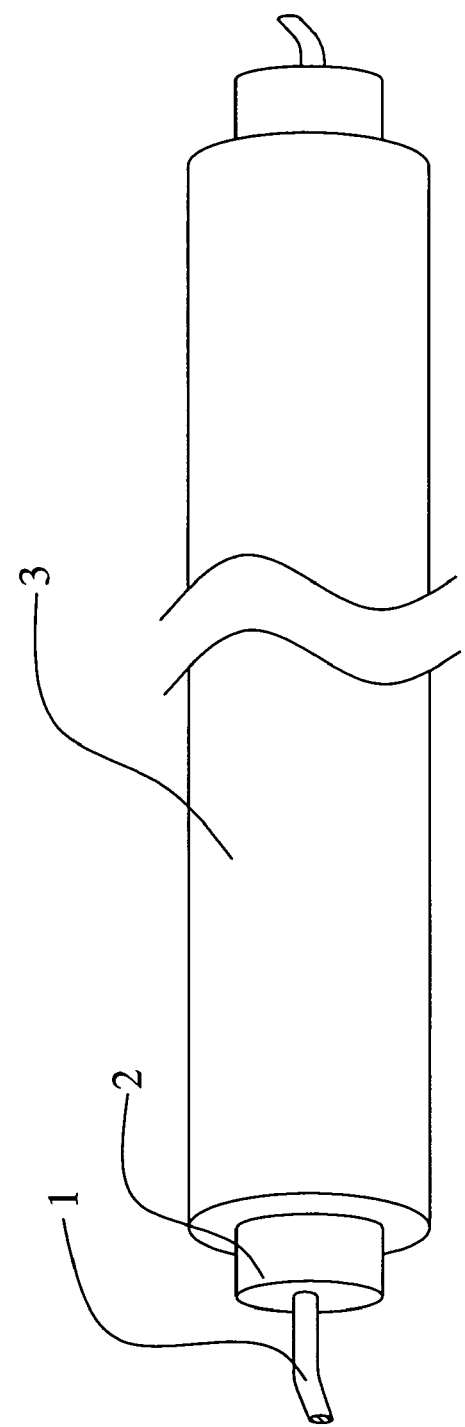

Referring now to FIG. 1b, a second preferred embodiment shielded cable of the present invention is illustrated. In this case, an insulating outer jacket 3 is added to the first embodiment device. The insulating outer jacket 3 allows the wire 1 and conductive loaded resin-based material 2 to be routed or to be handled without short-circuiting. The insulating outer jacket 3 is preferably formed by extrusion molding a non-conductive resin-based material over the conductive loaded resin-based material 2.

Referring now to FIG. 1c, a third preferred embodiment shielded cable of the present invention is illustrated. Here, the wire 4 and 5 comprises a conductive core 4 and an insulator 5. The insulator 5 surrounds the conductive core 4. A conductive loaded resin-based material 6 surrounds the insulator 5. Finally, an insulating outer jacket 7 surrounds the shielding 6. Note that, in this embodiment, the shielding 6 and the core conductor 4 are not shorted. This embodiment of a shielded cable is typically called a coaxial shielded cable or, merely, coaxial cable. Two signals can be transmitted over the coaxial shielded cable. One signal is transmitted by the core conductor 4, and another signal is transmitted by the shielding 6. In an exemplary application, the shielding 6 is connected to a dc reference or a ground signal while the core conductor 4 is connected to a signal.

The conductor 4 may comprise any conductive material and, more preferably, comprises a metal such as copper or aluminum as is well known in the art. The conductor 4 may comprise a solid piece of metal or a stranded cable comprising many strands of metal wound together as is well known in the art. An insulator 5 surrounds the conductor 5. The insulator 5 preferably comprises a material, such as polyethylene, that is non-conductive yet flexible. The conductive loaded resin-based shielding 6 and the insulating outer jacket 7 are preferably formed by co-extrusion. That is, the insulated wire 4 and 5 is pulled through a first extrusion molding machine, to form the conductive loaded resin-based shielding 6, and a second extrusion molding machine, to form the insulating outer jacket 7. The conductive loaded resin-based shielding 6 and the insulating outer jacket 7 preferably comprise the same base resin material to optimize bonding between the shield 6 and the jacket 7. However, the shield 6 and the jacket 7 may be formed of differing materials.

A connector, not shown, may be used to connect the shield 6 of the third embodiment shielded cable device to a ground reference. Alternatively, a solderable layer, not shown, may optionally be formed overlying the surface of the conductive loaded resin-based shield 6. For example, a metal layer may be formed by plating or by coating. If the method of formation is metal plating, then the resin-based structural material of the conductive loaded, resin-based material is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer may be formed by, for example, electroplating or physical vapor deposition.

Referring now to FIG. 1d, a fourth preferred embodiment of the present invention is illustrated. In this embodiment, a second conductor 8 is added to the shielded cable device of the third embodiment. The second conductor 8 runs parallel to the insulated wire 4 and 5. The second conductor 8 is separated from the first conductor 4 by the insulating layer 5. The conductive shield 7 again comprises a conductive loaded, resin-based material as in the first embodiment. However, the second conductor 8 allows the conductive shield 7 to be easily connected to a ground reference or a dc reference by simply attaching the exposed end of the second conductor using, for example, a metal connector or by soldering. The resulting coaxial cable device still benefits from the reduced cost and improved manufacturing flexibility of using a conductive loaded, resin-based material to form the conductive shield rather than using a metal foil, metal tape, of braided metal wire. The second conductor 8 may comprise any conductive metal material and, more preferably, comprises copper or aluminum. The second conductor 8 may comprise a solid piece of metal or a stranded cable comprising many strands of wire wound together.

Referring now to FIG. 1e, a fifth preferred embodiment of the present invention is illustrated. In this embodiment the wiring comprises a twisted pair of wires. A first wire is a conductor 9 and an insulator 10. A second wire is also a conductor 11 and an insulator 12. The first and second wires are twisted together. This type of twisted wire configuration is particularly useful in differential signal communications as is well known in the art. The shield 13 comprises a conductive loaded resin-based material according to the present invention. The shield 13 is preferably formed by extrusion molding overlying the twisted pair. An insulating outer jacket 14 is formed overlying the shield 13. Preferably, the shield 13 and the outer jacket 14 are formed by co-extrusion molding. A connector, not shown, may be used to connect the shield 13 of the fifth embodiment shielded cable device to a ground reference. Alternatively, a solderable layer, not shown, may optionally be formed overlying the surface of the conductive loaded resin-based shield 13.

Referring now to FIG. 1f, a sixth preferred embodiment of the present invention is illustrated. In this embodiment, an non-insulated grounding conductor 15 is added to the shielded cable device of the fifth embodiment. The grounding conductor 15 runs parallel to the twisted pair 9, 10, 11, and 12. The conductive shield 13 again comprises a conductive loaded, resin-based material as in the first embodiment. However, the grounding conductor 15 bonds with the conductive shield 13 so that the shield 13 can be easily connected to a ground reference or a dc reference by simply attaching the exposed end of the second conductor using, for example, a metal connector or by soldering. The resulting coaxial cable device still benefits from the reduced cost and improved manufacturing flexibility of using a conductive loaded, resin-based material to form the conductive shield rather than using a metal foil, metal tape, of braided metal wire. The grounding conductor 15 may comprise any conductive metal material and, more preferably, comprises copper or aluminum. The grounding conductor 15 may comprise a solid piece of metal or a stranded cable comprising many strands of wire wound together. An insulating outer jacket 14 is formed overlying the shield 13.

Referring now to FIG. 1g, a seventh preferred embodiment of the present invention is illustrated. In this embodiment, multiple twisted pairs of wires 9-18, perhaps hundreds of pairs, are routed in the shielded cable. A non-insulated grounding wire 19 is used to provide an easy connection to the conductive loaded resin-based shield 13. An insulating outer jacket 14 is formed overlying the shield 13.

Referring now to FIG. 1h, an eighth preferred embodiment of the present invention is illustrated. In this embodiment, multiple wires 21-28 are routed in the shielding cable. A non-insulated grounding wire 20 is again used to provide an easy connection to the conductive loaded, resin-based shield 28. An insulating outer jacket 14 is formed overlying the shield 13.

Figure 6:
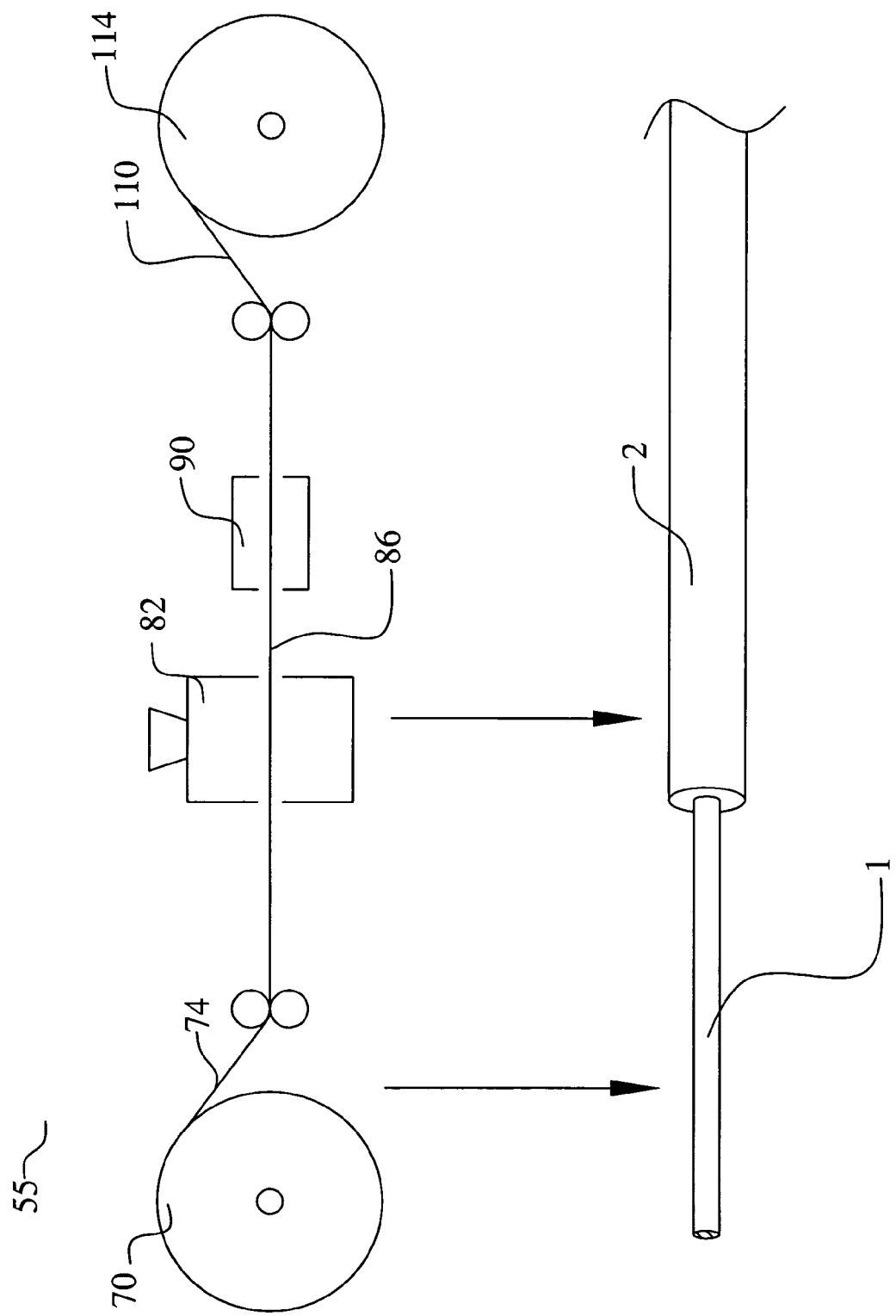
FIG. 6 illustrates a preferred embodiment of the present invention showing a method to form a single conductor, non-insulated cable using a single extrusion process.

The novel coaxial cable devices of the present invention may be formed using several manufacturing methods. The unique conductive loaded, resin-based materials used in the formation of the conductive shield 16 can easily be molded, cut, stamped, machined or milled. Referring now to FIG. 6 illustrates a method to form the shielded cable of the first preferred embodiment is illustrated. This first embodiment shielded cable comprises a non-insulated conductor 1 and a conductive loaded resin-based shield 2. In this case, the conductive shield is formed by an extrusion molding method. A simplified schematic of a manufacturing process 55 is shown. Arrows indicate the state of the shielded cable 1 and 2 at each stage of the manufacturing process flow 55. The process flow 55 begins with the previously formed, non-insulated conductor 74 pre-wound onto a spool or reel 70.

The conductor wire 74 is fed from the input reel 70 into the manufacturing line 55. The conductive shield 2 is formed using an extrusion molding technique at a first extruder 82. The composite mixture of resin-based material and conductive material, as described above, is continuously loaded into and homogeneously mixed in the first extruder 82. The composite material is applied to the surface of the conductor 1 to form a predefined thickness of conductive loaded, resin-based material 2 surrounding the conductor 1. The conductive loaded, resin-based material 2 is heated to cause curing and setting of the base resin. The partially assembled coaxial cable 86 leaves the first extruder 82 and enters a cooling chamber 90 to complete the curing and to bring the conductive shield to a proper temperature for the second extruder 94 for winding the shielded cable 110 onto the finished cable reel 114.

Figure 7:
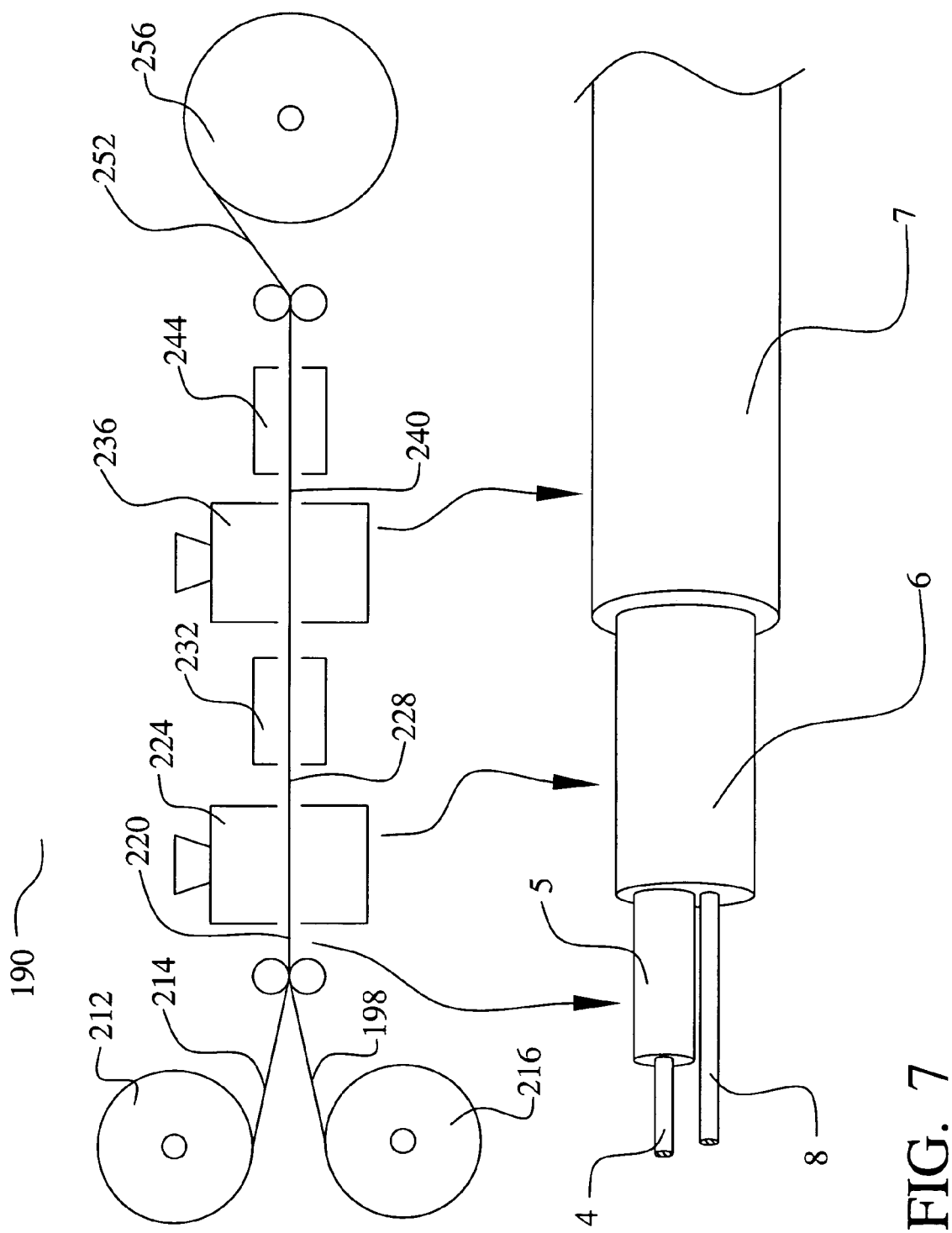
FIG. 7 illustrates a preferred embodiment of the present invention showing a method to form a shielded cable using a co-extrusion process to form the cable shield and the outer jacket.

Referring particularly to FIG. 7, another method 190 to form a shielded cable is illustrated. In this case, the shielding cable has an insulated conductive wire 4 and 5, a grounding conductor 8, a conductive loaded resin-based shield 6, and an insulated outer jacket 7. While a coaxial shielded cable is illustrated, this technique can easily be modified to manufacture a shielded cable with twisted pair, or multiple twisted pair, or multiple wires. In this method 190 both conductive shield 6 and the outer jacket 7 cable are formed by extrusion molding. Therefore, this method is a co-extrusion method.

A simplified schematic of the manufacturing process 190 is shown. The novel shielded cable is shown with arrows indicating the state of the cable at each stage of the manufacturing process flow. The process flow 190 begins with the previously formed insulated conductor 4 and 5 pre-wound onto a first spool or reel 212. At this point, the insulator layer 202 has already been formed surrounding the center conductor 194. Alternatively, the first reel 212 may hold only a conductor wire 4 that is then fed through a first process, not shown, in which the insulating layer 5 is formed around the conductor 4.

In this embodiment, a second input reel 216 holds the grounding conductor 8. The central conductor/insulator 214 and the grounding conductor 198 are first unwound from the first and second input reels 212 and 216 and then routed to the first extruder 224 as a combined cable 220. The conductive shield 206 is then formed using an extrusion molding technique at the first extruder 224. The composite mixture of resin-based material and conductive materials, as described above, is continuously loaded into and homogeneously mixed in the first extruder 224. The composite material is applied to the surface of the insulator 202 and the second conductor 198 to form a predefined thickness of conductive loaded, resin-based material 206 surrounding the insulator 202 and the second conductor 198. The conductive loaded, resin-based material 206 is heated to cause curing and setting of the base resin. The partially assembled coaxial cable 228 leaves the first extruder 224 and enters a cooling chamber 232 to complete the curing and to bring the conductive shield to a proper temperature for the second extruder 236.

In the second extruder 236, a non-conductive, resin-based material 7 is formed on the surface of the conductive shield 6. The non-conductive, resin-based material 7 is applied to the surface of the conductive shield 6 to form a predefined thickness surrounding the conductive shield 6. The non-conductive resin-based material 7 is heated to cause curing and setting of the base resin. The partially assembled coaxial cable 240 leaves the second extruder 236 and enters a cooling chamber 244 to complete the curing and to bring the completed cable 252 to a proper temperature for winding onto the finished cable reel 256. The base resin of the conductive loaded resin-based material 6 may be the same as the resin used for the outer jacket 7 to create excellent bonding. However, this is not an essential feature of the present invention.

Figure 8:
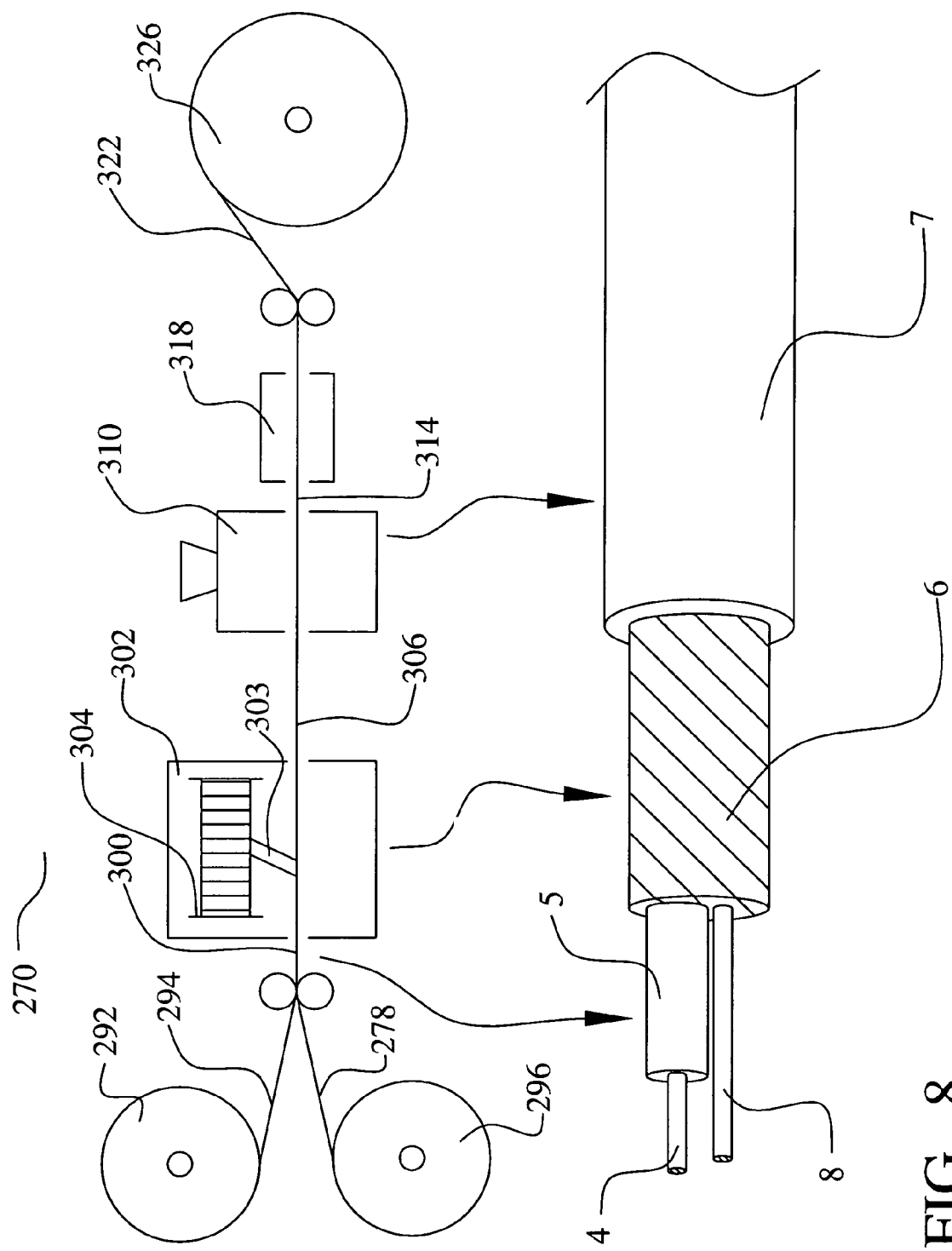
FIG. 8 illustrates a preferred embodiment of the present invention showing a method to form a shielded cable using a winding/wrapping process to form the cable shield using a fabric-like conductive loaded resin-based material.

Referring particularly now to FIG. 8, another method 270 of forming a shielded cable device of the present invention is illustrated. In this case, the conductive shield 6' of the shielded cable is formed by a wrapping method. A simplified schematic of the manufacturing process 270 is shown. The novel shielded cable device is shown with arrows indicating the state of the cable at each stage of the manufacturing process flow. While a coaxial shielded cable is illustrated, this technique can easily be modified to manufacture a shielded cable with twisted pair or multiple twisted pair or multiple wires.

The process flow 270 again begins with the previously formed insulated conductor 4 and 5 pre-wound onto a first input spool or reel 292. At this point, the insulator layer 5 has already been formed surrounding the center conductor 4. Alternatively, the first input reel 292 may hold only a conductor 4 that is then fed through a first process, not shown, in which an insulating layer 5 is formed around the conductor 4.

A second input reel 296 again holds a grounding conductor 8. The central conductor/insulator 294 and the grounding conductor 278 are first unwound from the first and second input reels 292 and 296 and then routed to the winder 302 as a combined wire 300. The conductive shield 286 is formed using a wrapping or winding technique at the winder 302. In this embodiment, the conductive loaded, resin-based material has been pre-formed into a conductive loaded resin-based fabric-like material as described in the present invention. This conductive loaded resin-based fabric-like material 303 is pre-wound onto a reel 304 in the winder 302. The conductive loaded resin-based fabric 303 is wound or wrapped onto the surface of the insulator 282 and of the grounding conductor 278 to form a predefined thickness of conductive loaded, resin-based material 6' surrounding the insulator 282 and the grounding conductor 278. The conductive shield 6' may comprise a single wrapping direction or may comprise multiple wrapping directions or an interweave or a braiding or the conductive loaded resin-based fabric 6'.

The partially completed coaxial cable 306 next enters an extruder 310. Here, a non-conductive, resin-based material 7 is formed on the surface of the conductive shield 286. The non-conductive, resin-based material 7 is applied to the surface of the conductive shield 6' to form a predefined thickness surrounding the conductive shield 6'. The non-conductive resin-based material 7 is heated to cause curing and setting of the base resin. The partially assembled coaxial cable 314 leaves the extruder 310 and enters a cooling chamber 318 to complete the curing and to bring the completed cable 322 to a proper temperature for winding onto the finished cable reel 326.

Alternative methods of forming the coaxial cable device from the conductive loaded, resin-based material include over-molding, lamination, milling, stamping, or cutting. Milling and cutting are performed on conductive loaded resin-based material that is already cured into a block or sheet.

Figure 2:
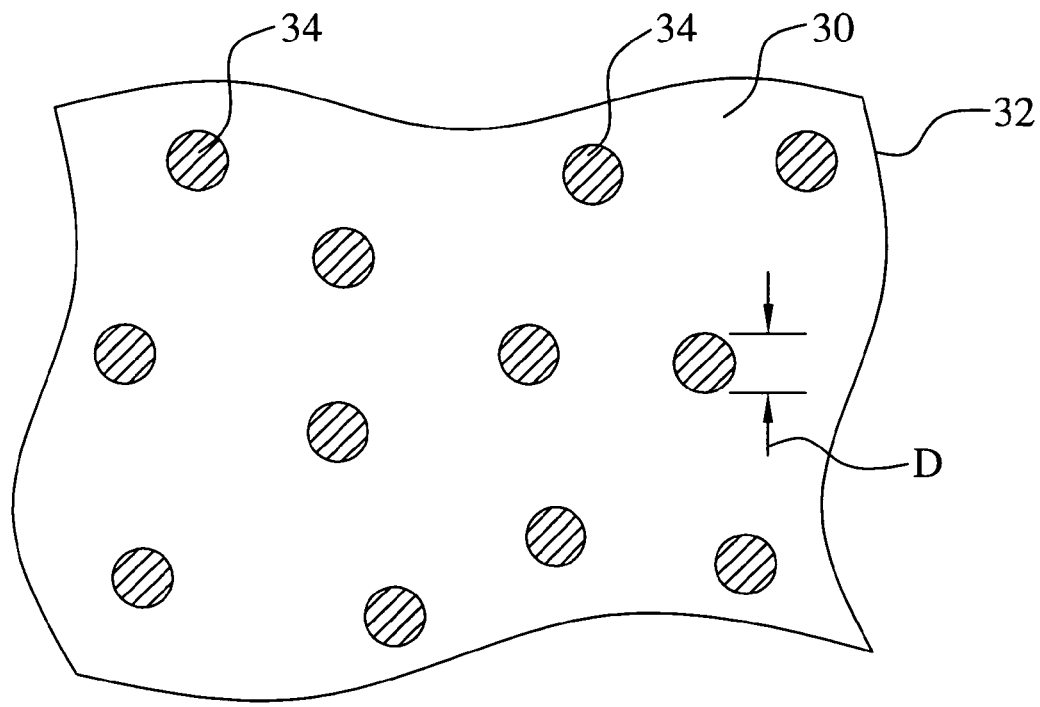
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
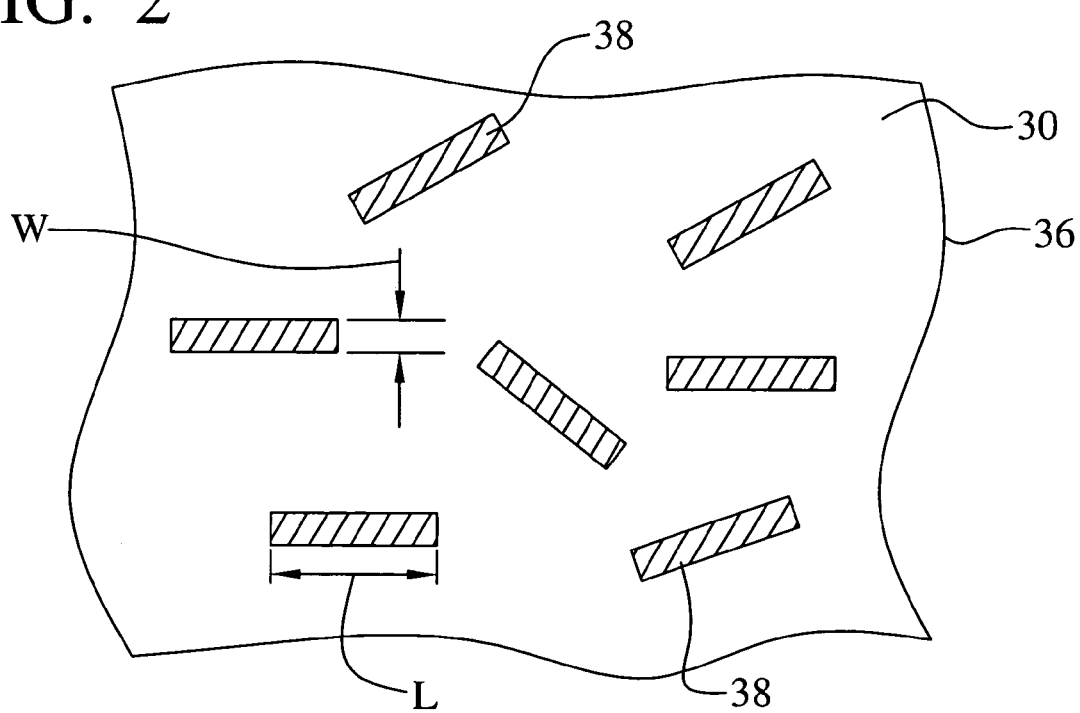
FIG. 3 illustrates a second preferred embodiment of a conductive loaded resin-based material wherein the conductive materials comprise micron conductive fibers.
Figure 4:
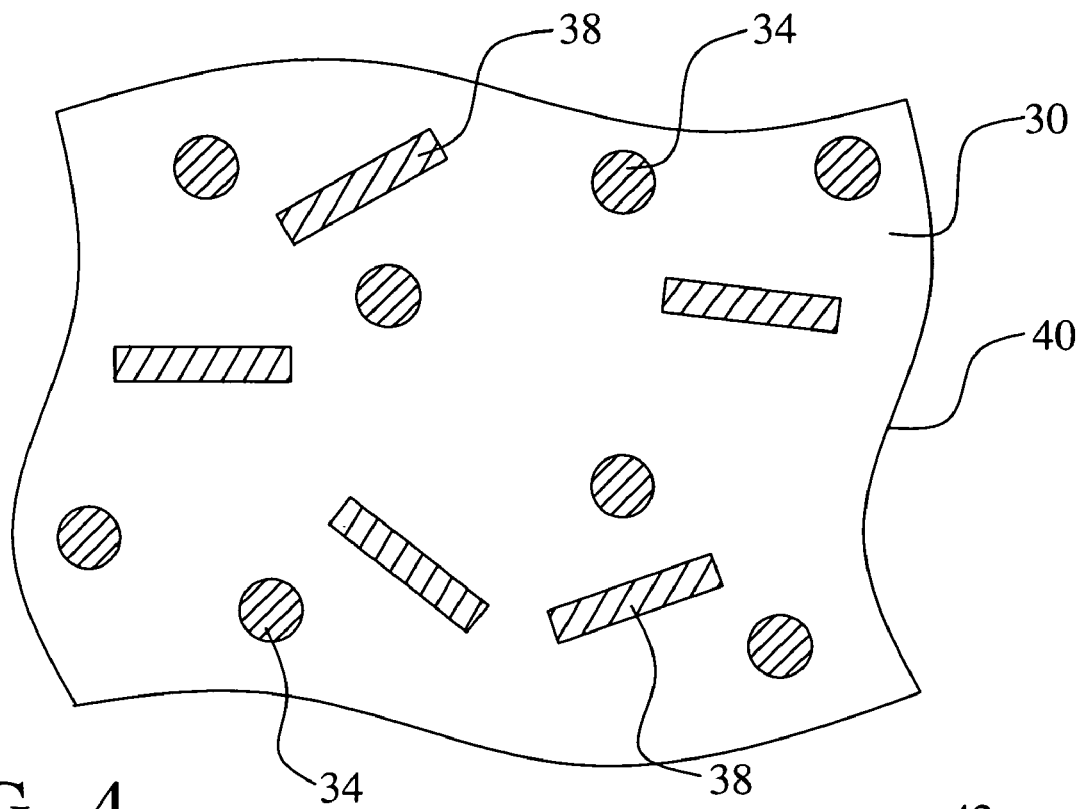
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.2 and 0.40, and is preferably about 0.30. Stainless Steel Fiber of 8-11 micron in diameter and lengths of 4-6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
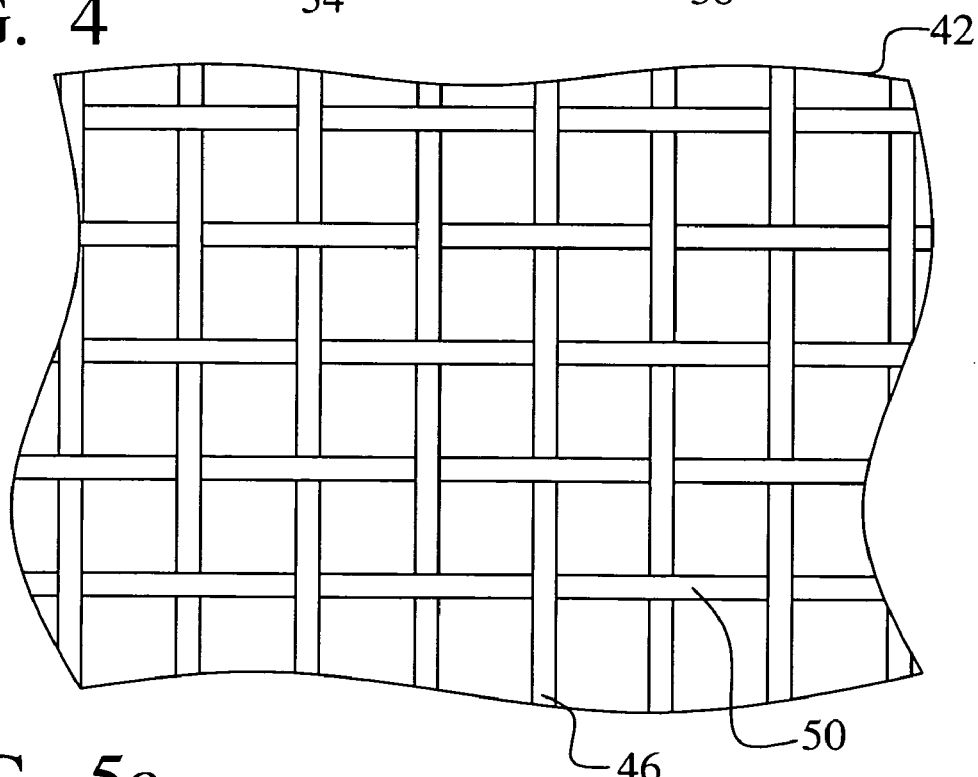
FIGS. 5a and 5b illustrate a fourth preferred embodiment wherein conductive fabric-like materials are formed from the conductive loaded resin-based material.
Figure 5B:
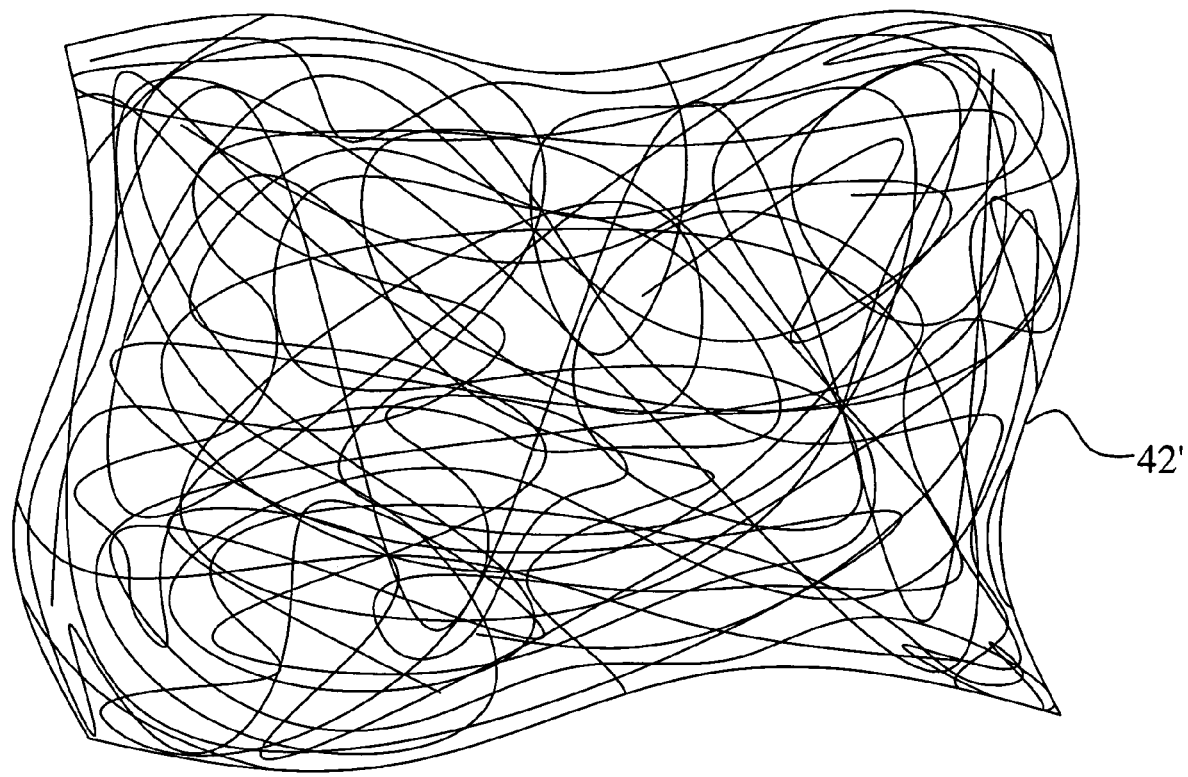

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

The advantages of the present invention may now be summarized. An effective shielded cable device is achieved. A method to form a shielded cable device is achieved. The shielded cable device has a shield molded of conductive loaded resin-based materials. A cable shield molded of conductive loaded resin-based materials is achieved where the cable shield is formed by extrusion. A cable shield molded of conductive loaded resin-based materials is achieved where the cable shield is formed by wrapping a fabric-like conductive loaded resin-based material. A shielded cable is achieved where the cable shield and the outer jacket are co-extruded.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A shielded cable device comprising:
   A conductor; and
   a conductive shield surrounding said conductor wherein said conductive shield comprises a conductive loaded, resin-based material comprising micron conductive metal powder in a base resin host wherein the ratio, by weight, of said micron conductive metal powder to said resin host is between 0.20 and 0.40.

2. The device according to claim 1 wherein said metal powder is nickel, copper, silver, or is a material plated with nickel, copper, or silver.

3. The device according to claim 1 wherein said metal powder comprises a diameter of between about 3 μm and about 12 μm.

4. The device according to claim 1 further comprising non-metal powder.

5. The device according to claim 4 wherein said non-metal powder is carbon, graphite, or an amine-based material.

6. The device according to claim 1 further comprising micron conductive fiber.

7. The device according to claim 6 wherein said micron conductive fiber is nickel plated carbon fiber, stainless steel fiber, copper fiber, silver fiber or combinations thereof.

8. The device according to claim 6 wherein said micron conductive fiber pieces each have a diameter of between about 3 μm and about 12 μm and a length of between about 2 mm and about 14 mm.

9. The device according to claim 1 wherein said conductor comprises a wire with a surrounding insulating layer.

10. The device according to claim 9 further comprising a metal layer overlying a part of said conductive shield.

11. The device according to claim 9 further comprising a grounding conductor embedded in said conductive shield.

12. The device according to claim 9 further comprising an insulating outer jacket surrounding said conductive shield.

13. The device according to claim 12 wherein said insulating outer jacket comprises a resin-based material.

14. The device according to claim 13 wherein said resin host of said conductive shield is the same material composition as said resin-based material of said insulating outer jacket.

15. The device according to claim 9 further comprising at least one additional conductor wherein said additional conductor comprises a wire with a surrounding insulating layer.

16. The device according to claim 15 wherein said conductor and said additional conductor are twisted together to form a twisted pair of signal wires.

17. The device according to claim 16 further comprising at least one additional twisted pair of signal wires.

18. A shielded cable device comprising:
    A conductor wherein said conductor comprises a wire with a surrounding insulating layer;
    a conductive shield surrounding said conductor wherein said conductive shield comprises a conductive loaded, resin-based material comprising micron conductive non-plated metal fiber in a base resin host wherein the ratio, by weight, of said micron conductive non-plated metal fiber to said resin host is between 0.20 and 0.40; and
    an insulating outer jacket surrounding said conductive shield.

19. The device according to claim 18 further comprising metal powder.

20. The device according to claim 18 further comprising non-metal powder.

21. The device according to claim 18 further comprising a combination of metal powder and non-metal powder.

22. The device according to claim 18 further comprising a metal layer overlying a part of said conductive shield.

23. The device according to claim 18 further comprising a grounding conductor embedded in said conductive shield.

24. The device according to claim 18 wherein said insulating outer jacket comprises a resin-based material.

25. The device according to claim 18 further comprising at least one additional conductor wherein said additional conductor comprises a wire with a surrounding insulating layer.

26. The device according to claim 25 wherein said conductor and said additional conductor are twisted together to form a twisted pair of signal wires.

27. The device according to claim 26 further comprising at least one additional twisted pair of signal wires.

28. A method to form a shielded cable device, said method comprising:
    extruding a conductive loaded, resin-based material onto a conductor to thereby form a conductive shield on said conductor wherein said conductive loaded, resin-based material comprises micron conductive non-plated metal fiber and wherein the ratio, by weight, of said conductive materials to said resin host is between 0.20 and 0.40; and
    curing said conductive loaded, resin-based material.

29. The method according to claim 28 further comprising a conductive powder.

30. The method according to claim 28 further comprising extruding an insulating outer jacket onto said conductive shield.

31. The method according to claim 28 further comprising forming a metal layer overlying a part of said conductive shield.

32. The method according to claim 31 wherein said step of forming a metal layer around said conductive loaded, resin-based material is by plating or by coating said metal layer.

* * * * *

UNITED STATES PATENT AND TRADEMARK OFFICE
CERTIFICATE OF CORRECTION

PATENT NO. : 7,244,890 B2  Page 1 of 1
APPLICATION NO. : 10/811371
DATED : July 17, 2007
INVENTOR(S) : Aisenbrey It is certified that error appears in the above-identified patent and that said Letters Patent is hereby corrected as shown below:

Title Page Item 73 Insert
--Assignee: Integral Technologies, Inc.,
Bellingham, WA (US)--

Signed and Sealed this
Third Day of May, 2011

David J. Kappos
*Director of the United States Patent and Trademark Office*